United States Patent
Park et al.

(10) Patent No.: US 10,007,182 B2
(45) Date of Patent: Jun. 26, 2018

(54) PHOTORESIST COMPOSITION AND METHOD OF MANUFACTURING SEMICONDUCTOR DEVICE USING THE SAME

(71) Applicant: SAMSUNG ELECTRONICS CO., LTD., Suwon-si, Gyeonggi-do (KR)

(72) Inventors: Jin Park, Yongin-si (KR); Hyun Woo Kim, Seongnam-si (KR); Jin Kyu Han, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 1 day.

(21) Appl. No.: 15/293,756

(22) Filed: Oct. 14, 2016

(65) Prior Publication Data

US 2017/0199456 A1    Jul. 13, 2017

(30) Foreign Application Priority Data

Jan. 11, 2016 (KR) .................. 10-2016-0003186

(51) Int. Cl.
*C03C 15/00* (2006.01)
*G03F 7/039* (2006.01)
(Continued)

(52) U.S. Cl.
CPC .......... *G03F 7/0397* (2013.01); *G03F 7/0048* (2013.01); *G03F 7/162* (2013.01);
(Continued)

(58) Field of Classification Search
CPC .......... G03F 7/00; G03F 7/0002; G03F 7/004; G03F 7/0045; G03F 7/0048; G03F 7/0397; G03F 7/162; G03F 7/20; G03F 7/322; G03F 7/40; H01L 21/3065; H01L 31/308; H01L 21/30655; H01L 21/31144; H01L 21/312
(Continued)

(56) References Cited

U.S. PATENT DOCUMENTS 6,022,963 A    2/2000  McGall et al.
6,147,205 A    11/2000 McGall et al.
(Continued)

FOREIGN PATENT DOCUMENTS

EP    1325017       7/2003
JP    2005523232    8/2005
(Continued)

*Primary Examiner* — Lan Vinh
(74) *Attorney, Agent, or Firm* — F. Chau & Associates, LLC

(57) ABSTRACT

Provided are a photoresist composition and a method of manufacturing a semiconductor device using the same. The method of manufacturing a semiconductor device comprises forming a mask layer and a photoresist layer on a substrate, forming a photoresist pattern by patterning the photoresist layer, forming a mask pattern by patterning the mask layer through the photoresist pattern and forming a pattern by etching the substrate using the mask pattern, wherein the formation of the photoresist layer comprises forming the photoresist layer, using a photoresist composition comprising a polymer which includes a protecting group that causes decarboxylation by radical.

20 Claims, 5 Drawing Sheets

(51) Int. Cl.
- *H01L 21/027* (2006.01)
- *H01L 21/3065* (2006.01)
- *H01L 21/308* (2006.01)
- *G03F 7/20* (2006.01)
- *G03F 7/32* (2006.01)
- *G03F 7/16* (2006.01)
- *G03F 7/40* (2006.01)
- *G03F 7/004* (2006.01)

(52) U.S. Cl.
CPC ................ *G03F 7/20* (2013.01); *G03F 7/322* (2013.01); *G03F 7/325* (2013.01); *G03F 7/40* (2013.01); *H01L 21/0273* (2013.01); *H01L 21/308* (2013.01); *H01L 21/3065* (2013.01)

(58) Field of Classification Search
USPC ................ 216/41, 44, 47, 49; 438/695, 725
See application file for complete search history.

(56) References Cited

U.S. PATENT DOCUMENTS

| | | | |
|---|---|---|---|
| 6,566,515 B1 | 5/2003 | McGall et al. | |
| 6,881,836 B2 | 4/2005 | McGall et al. | |
| 7,470,783 B2 | 12/2008 | McGall et al. | |
| 7,867,687 B2 | 1/2011 | Yueh et al. | |
| 8,329,384 B2 * | 12/2012 | Watanabe | G03F 7/0035 430/270.1 |
| 8,426,103 B2 | 4/2013 | Yamashita | |
| 8,895,231 B2 | 11/2014 | Hatakeyama et al. | |
| 8,951,712 B2 | 2/2015 | Hatakeyama | |
| 9,005,873 B2 | 4/2015 | Sakamoto et al. | |
| 2003/0040618 A1 | 2/2003 | Barone et al. | |
| 2005/0101765 A1 | 5/2005 | Barone et al. | |
| 2009/0076295 A1 | 3/2009 | Barone et al. | |
| 2009/0258796 A1 * | 10/2009 | Rajasekaran | C07K 1/047 506/18 |
| 2010/0280234 A1 | 11/2010 | McGall et al. | |
| 2010/0324266 A1 | 12/2010 | Barone et al. | |
| 2011/0028350 A1 | 2/2011 | McGall et al. | |
| 2011/0170075 A1 * | 7/2011 | Gao | B01J 19/0046 355/18 |
| 2015/0147696 A1 | 5/2015 | Eguchi et al. | |
| 2015/0168831 A1 | 6/2015 | Nishimura et al. | |
| 2015/0170905 A1 | 6/2015 | Tran et al. | |
| 2015/0262815 A1 | 9/2015 | Wu et al. | |

FOREIGN PATENT DOCUMENTS

| | | |
|---|---|---|
| WO | 1998039348 | 9/1998 |
| WO | 2002020150 | 3/2002 |

* cited by examiner

PHOTORESIST COMPOSITION AND METHOD OF MANUFACTURING SEMICONDUCTOR DEVICE USING THE SAME

CROSS-REFERENCE TO RELATED APPLICATION

This application claims priority under 35 U.S.C. 119 to Korean Patent Application No. 10-2016-0003186, filed on Jan. 11, 2016, in the Korean Intellectual Property Office, the disclosure of which is incorporated by reference herein in its entirety.

TECHNICAL FIELD

The present inventive concept generally relates to a photoresist composition and a method of manufacturing a semiconductor device using the same, more particularly, to a non-chemically amplified (Non-CAR) photoresist composition and a method of manufacturing a semiconductor device using the same.

DISCUSSION OF RELATED ART

Recently, with the rapid spread of the information media, functions of semiconductor devices have advanced dramatically. To ensure higher levels of competitiveness, new semiconductor products also require higher integration to achieve lower cost and higher quality. To achieve higher integration, the semiconductor industry has relied on the continued scaling-down of the minimum feature sizes of the semiconductor devices.

As the integration density of the semiconductor devices increases, the design rules of the components of the semiconductor devices may be reduced. To achieve high integration density, the semiconductor devices may require to provide fine patterns having a fine line width that transcends a resolution limit of a photolithography device in the manufacturing process.

To provide a semiconductor pattern having a fine line width, the photoresist pattern of the photoresist layer also needs to be provided with the fine line width, and requires to have local CD uniformity (LCDU), low line edge roughness (LER) and low line width roughness (LWR).

SUMMARY

An aspect of the present inventive concept provides a method of manufacturing a semiconductor device, the method comprises forming a mask layer and a photoresist layer on a substrate, forming a photoresist pattern by patterning the photoresist layer, forming a mask pattern by patterning the mask layer through the photoresist pattern and forming a pattern by etching the substrate using the mask pattern, wherein the formation of the photoresist layer comprises forming the photoresist layer using a photoresist composition comprising a polymer which includes a protecting group that causes decarboxylation by radical.

In an exemplary embodiment of the present inventive concept, the polymer is a polymer expressed by at least one of Chemical Formulas 1 through 3 described below:

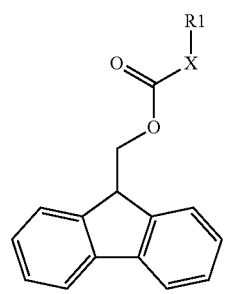

<Chemical Formula 1>

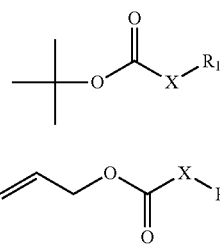

<Chemical Formula 2>

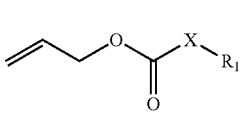

<Chemical Formula 3> wherein R1 comprises an alkyl chain of C1 through C20, and X is O, N or S.

Another aspect of the present inventive concept provides a photoresist composition, the photoresist composition comprises a polymer including a protecting group that causes a decarboxylation by radical, and an organic solvent.

Still another aspect of the present inventive concept provides a method of manufacturing a semiconductor device, the method comprises: providing a substrate having a mask layer on top of the substrate; depositing a photoresist layer on the mask layer, the photoresist layer comprising a polymer which includes a repeating unit represented by Chemical Formula A or Chemical Formula B as shown below:

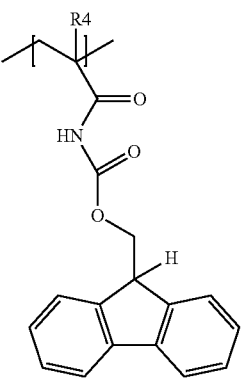

<Chemical Formula A>

<Chemical Formula B>

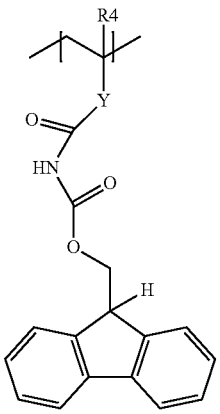

wherein R4 represents hydrogen, methyl, ethyl, propyl, or trifluoromethyl, and Y represents a divalent linking group of C1 to C30 aliphatic group, C1 to C30 aromatic group, or any combination thereof, and Y optionally includes N, O, S, halides, or any combination thereof; patternwise exposing the photoresist layer through a photomask with an EUV light, or an excimer laser light, or without a photomask with a particle beam to form an exposed photoresist layer; developing the exposed photoresist layer with an aqueous TMAH developer or an alcohol-based solvent to form a photoresist pattern; etching the mask layer using the photoresist pattern as an etching mask to form a mask pattern; and etching the substrate using the mask pattern as an etching mask to form a device pattern.

BRIEF DESCRIPTION OF THE DRAWINGS

The above and other aspects and features of the present inventive concept will become more apparent by describing in detail exemplary embodiments thereof with reference to the accompanying drawings, in which.

Figure 1:
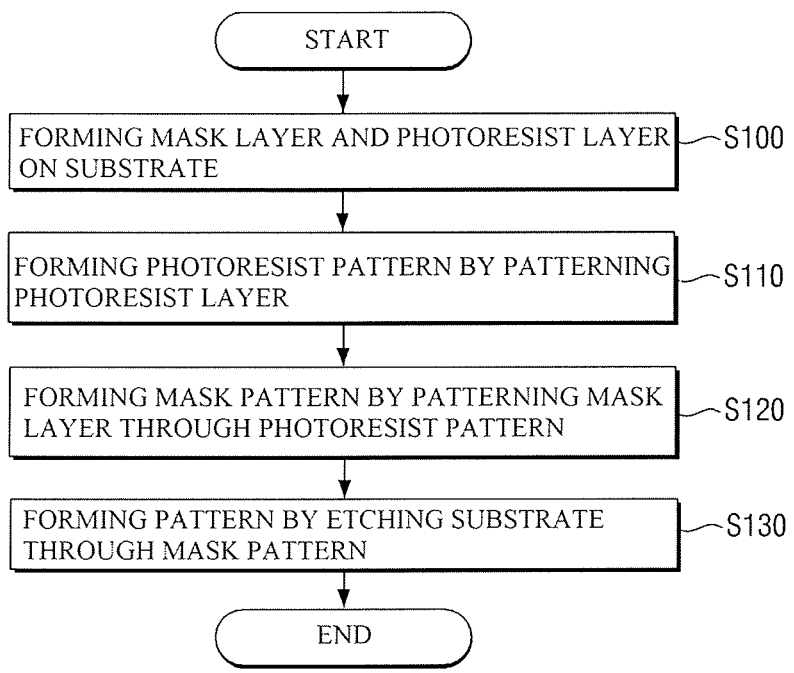
FIG. 1 is a flowchart for explaining a method for manufacturing the semiconductor device according to an exemplary embodiment of the present inventive concept.

Since the drawings in FIGS. 1-12 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Features of the present inventive concept and methods of accomplishing the same may be understood more readily by reference to the following detailed description of example embodiments and the accompanying drawings. The present inventive concept may, however, be embodied in many different forms and should not be construed as being limited to the specific exemplary embodiments set forth herein. Rather, these embodiments are provided so that this disclosure will be thorough and complete and will fully convey the concept of the disclosure to those skilled in the art.

Like numbers refer to like elements throughout the specification and the accompany drawings. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first", "second", and the like, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a", "an", "the" and similar referents in the context of describing the inventive concept (especially in the context of the following claims) are to be construed to cover both the singular and the plural, unless otherwise indicated herein or clearly contradicted by context.

Hereinafter, a photoresist composition according to an exemplary embodiment of the present inventive concept, a method of forming a pattern using the same, and a method of manufacturing the semiconductor device will be described in detail with reference to the accompanying drawings. However, the present inventive concept is not limited to the following examples and may be provided in various other forms within the scope that does not depart from the technical idea of the present inventive concept.

As a photoresist for forming a fine pattern, there is a chemically amplified resist (CAR). In general, the chemically amplified photoresist is prepared by blending a polymer having a structure sensitively reacting with an acid, together with a photoacid generator, as main ingredients.

The chemical amplification refers to a phenomenon in which active species generated by the action of a single photon causes a cascade of subsequent chemical reactions and consequently a quantum yield is greatly amplified. In the chemically amplified photoresist, an acid is generated from the photoacid generator by the irradiation of light, and a chemical bond breaking or a decomposition reaction of the acid-reactive polymer occurs by the catalytic chemical action of the acid. While being subjected to a post-exposure baking (PEB) process, the acid present in the exposed portion acts as a catalyst to amplify a chemical reaction of the acid-reactive substance and to induce a difference in solubility between the exposed portion and the unexposed portion.

The acid generated in the exposed portion may diffuse to the unexposed portion rather than only stays in the exposed portion, during the time of the application of heat after the exposure (a post exposure bake). Accordingly, the line width roughness increases, and a phenomenon of extension of the inter-pattern may occur. Further, since the acid of the surface portion may be neutralized by base species (e.g., $NH_3$ etc.) in the air, the reactivity of the acid at the surface portion may then be reduced. Further, in severe cases, a surface insoluble layer may be formed, and a pattern profile of the photoresist may become uneven. For example, a T-top pattern profile may be formed.

To solve the above described problems, it is necessary to control the behavior of the acid (e.g., hydrogen ions, i.e., protons) generated in the exposed portion, but such a control is not easy. Therefore, to overcome the disadvantages of the chemically amplified photoresist, a non-chemically amplified resist (Non-CAR) has been invented, and the photoresist according to an exemplary embodiment of the present inventive concept may include a non-chemically amplified photoresist.

The photoresist composition according to an exemplary embodiment of the present inventive concept may include (a) a polymer containing a protecting group that causes decarboxylation by a radical and (b) an organic solvent. Here, the decarboxylation refers to a reaction that separates carbon dioxide ($CO_2$) from an organic compound having a carboxyl group, and refers to a reaction that removes the protecting group using the decarboxylation due to the radical in the present embodiment.

In the photoresist composition according to an exemplary embodiment of the present inventive concept, after forming the photoresist layer, secondary electron generated due to the laser interaction with the polymer during the exposure process may act as the radical to remove the protecting group included in the photoresist layer. That is, unlike the chemically amplified photoresist composition, since it is possible to directly remove the protecting group by the secondary electron, without going through the step of removing the protecting group through a hydrogen ion catalyzed reaction, there is no problem associated with the behavior of the hydrogen ion.

The protecting group that causes the decarboxylation by the radical, for example, may be a fluorenylmethoxycarbonyl (FMOC) protecting group. The Chemical Formula of the FMOC protecting group may be expressed by the following chemical Formula.

<Chemical Formula 1>

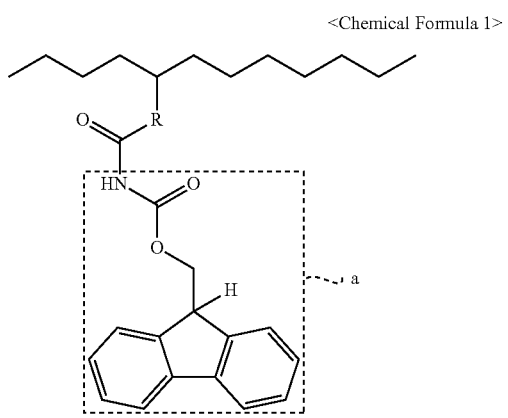

Here, Chemical Formula 1 may be referred to as R—C(O)—NH-FMOC, and a region of a dotted line 'a' may be a region that includes the protecting group to be removed through the radical.

Here, R represents hydrogen, substituted or unsubstituted C1-C4 alkyl, substituted or unsubstituted C1-C4 alkoxy, or substituted or unsubstituted phenyl. Here "C1-C4" means having 1 to 4 carbon atoms. Furthermore, R may represent hydrogen, substituted or unsubstituted C1-C30 alkyl, substituted or unsubstituted C1-C30 alkoxy, substituted or unsubstituted C1-C30 alkoxyalkyl, substituted or unsubstituted C4-C30 aliphatic cyclic hydrocarbon, substituted or unsubstituted C6-C30 lactone structure-containing aliphatic hydrocarbon, substituted or unsubstituted C6-C30 aryl, substituted or unsubstituted C6-C30 heteroaryl or substituted or unsubstituted C6-C30 aryloxy, and may be connected to alkyl chain of C1-C20. When R is connected to an alkyl chain, it represents a divalent group for each of the above described structures. For example, R may represent substituted or unsubstituted C1-C4 alkylene, substituted or unsubstituted C1-C4 alkyleneoxy, or substituted or unsubstituted phenylene. There may be two or more FMOC groups linked to the alkyl chain. Polar group or base soluble group may also link to the alkyl chain. The base soluble functional group may be, for example, a hydroxyl group, a carboxylic acid group, a sulfonamide, a dicarboxyimide, a fluoroalcohol, an N-hydroxy dicarboxyimide, an amino group, an imino group, combinations thereof, and the like. These groups are also polar groups. Instead of acting as a linking group between C(O)—NH-FMOC and alkyl chain, R may represent a polymer having C12-C100 alkyl chain as a backbone.

The protecting group through Chemical Formula 1 is an example, and the technical idea of the present inventive concept is not limited thereto.

The deprotection mechanism of removing a fluorenylmethoxycarbonyl (FMOC) protecting group using the radical according to the technical idea of the present inventive concept will be described in more detail using Chemical Formulas 2 and 3.

<Chemical Formula 2>

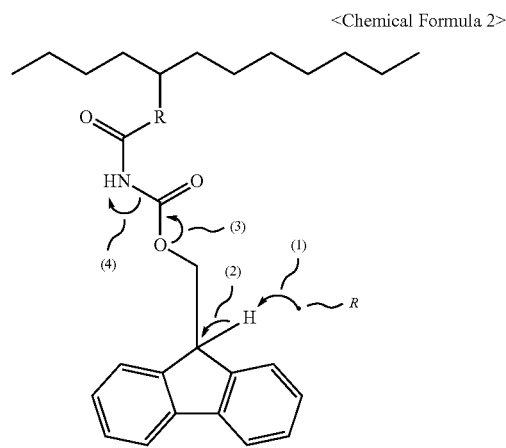

Referring to the above Chemical Formula 2, the deprotection mechanism may be settled via a total of four steps. First, at step (1), the radical (R) as the secondary electron generated in the exposure process causes a photochemical reaction with hydrogen (H) coupled to the FMOC protecting group. In this embodiment, hydrogen (H) may perform the role as a trigger for starting the deprotection mechanism. That is, when there is hydrogen (H) that is relatively weakly coupled to the FMOC protecting group, the FMOC deprotection mechanism according to the present embodiment may be performed.

Through the aforementioned photochemical reaction, the transfer reaction of electrons (−) may be successively performed. That is, the electrons (−) are finally provided to HN via the transfers of step (2), step (3) and step (4), in accordance with the direction of arrow of Chemical Formula 2.

<Chemical Formula 3>

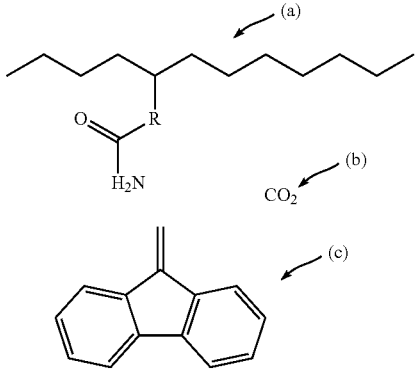

Through the reactions of the steps (1) to (4), the FMOC protecting group is removed, and carbon dioxide (b) may be released. Further, after the deprotection mechanism is performed, amide (a) containing amine or carboxylic acid (b) containing oxygen may remain. Therefore, the deprotection mechanism of the FMOC protecting group according to the present embodiment includes the decarboxylation as described above, and thus, carbon dioxide is released.

In the present embodiment, although the deprotection mechanism using the FMOC-protecting group has been described, the technical idea of the present inventive concept is not limited thereto. That is, as long as the protecting group includes atoms weakly coupled thereto and may react with the radical to perform the decarboxylation, the deprotection mechanism of the present inventive concept may be applied via the chain reaction of the above-described four steps.

The protecting groups capable of performing such reactions described above may be expressed by the following basic chemical Formulas. However, these Chemical Formulas are also examples, and as discussed above, the technical idea of the present inventive concept is not limited thereto.

<Chemical Formula 4>

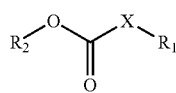

Chemical Formula 4 may be a basic Chemical Formula to which the aforementioned deprotection mechanism may be applied. That is, a chemical containing the structures such as Chemical Formula 4 may be a chemical to which the technical idea of the present inventive concept can be applied.

In Chemical Formula 4, X may be nitrogen (N), oxygen (O) or sulfur (S). Also, R1 and/or R2 may be an alkyl group containing aliphatic compounds.

When comparing the Chemical Formula 4 with Chemical Formula 3 to describe the present embodiment, R1 may be a portion included in the portion (a) of Chemical Formula 3, and R2 may be a portion included in the portion (c) of Chemical Formula 3. That is, in the present embodiment, R2 may include an atom in which the radical as the secondary electron is coupled to the protecting group in the course of exposure, e.g., a portion that causes the photochemical reaction with hydrogen and is separated. That is, when the aforementioned Chemical Formula 3 is expressed in the form corresponding to the chemical Formulas 4, it may be the following Chemical Formula 5.

<Chemical Formula 5>

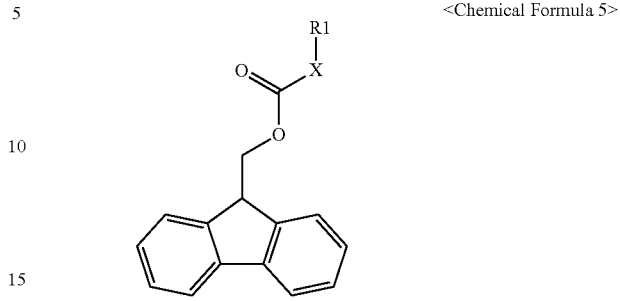

Chemical Formula 4 as the basic Chemical Formula may be variously expressed by Chemical Formula 6 through Chemical Formula 9 below.

<Chemical Formula 6>

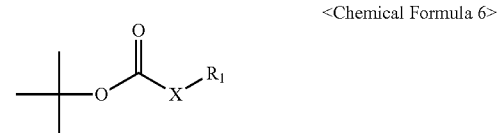

<Chemical Formula 7>

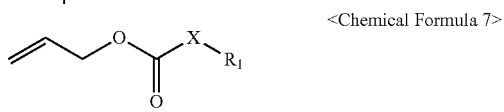

<Chemical Formula 8>

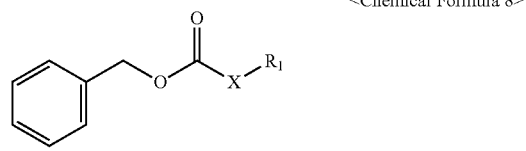

<Chemical Formula 9>

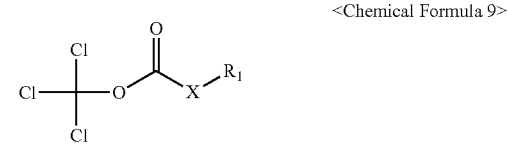

In the aforementioned Chemical Formulas 6 to 9, each as the polymer of the photoresist composition, the deprotection mechanism described through Chemical Formulas 1 to 3 may be applied in a substantially same or similar manner. In the present example, the expression "the deprotection mechanism may be applied" does not mean that the exactly same deprotection mechanism as the deprotection mechanism described through Chemical Formulas 1 to 3 is applied. Thus, in the present embodiment, the expression "the deprotection mechanism may be applied" should be understood that the deprotection mechanism in which the hydrogen ions do not occur is applied when removing the protecting group through the exposure process.

The above-mentioned Chemical Formulas are also examples, and as described above, the protecting group that causes the decarboxylation using the radical is included, and the technical idea of the present inventive concept may be applied to a polymer in which hydrogen ions are not generated upon the removal of the protecting group through the exposure process.

The photoresist composition according to an exemplary embodiment of the present inventive concept may further include groups of R3 and Ra in the polymer as shown in Chemical Formula 10.

<Chemical Formula 10>

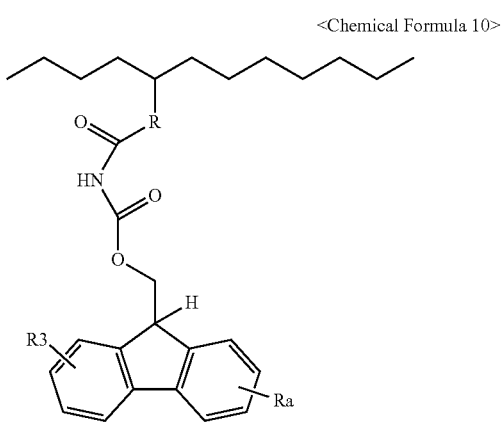

Here, R3 and Ra are disposed on the phenyl rings, and each may include at least one of N, O, halides, and an aliphatic carbon chain (C1 to 20).

The photoresist composition according to an exemplary embodiment of the present inventive concept may include a polymer containing FMOC protecting group that causes decarboxylation by a radical, and may include a repeating unit represented by Chemical Formula 11 or Chemical Formula 12 as shown below.

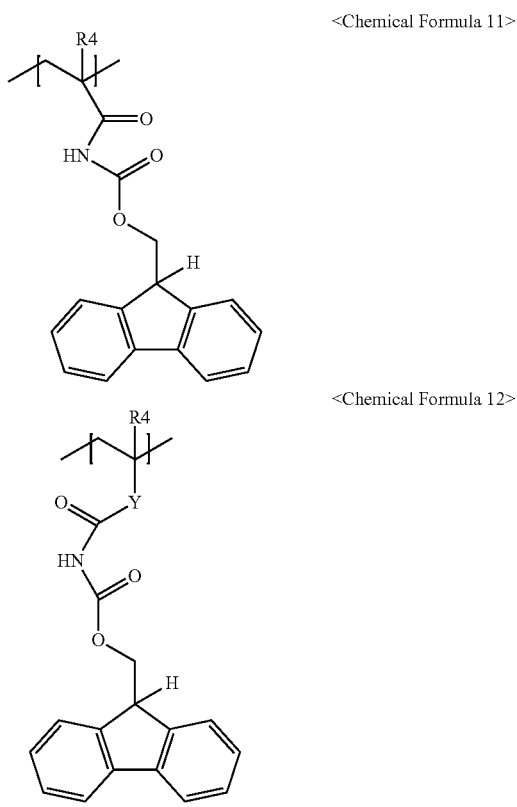

<Chemical Formula 11>

<Chemical Formula 12>

In Chemical Formula 11 and 12, R4 represents hydrogen, methyl, ethyl, propyl, or trifluoromethyl. Y is a divalent linking group, and represents C1-C30 aliphatic group, C1-C30 aromatic group, or any combination thereof. Y may contain one or more elements other than carbon such as, for example, N, O, S, and halides. The polymer included in the photoresist composition may have two or more repeating units represented by Chemical Formula 11, Chemical Formula 12, or the combination of both. The polymer may also include other repeating unit which has polar group or base soluble functional group, for example, a hydroxyl group, a carboxylic acid group, a sulfonamide, a dicarboxyimide, a fluoroalcohol, an N-hydroxy dicarboxyimide, an amino group, an imino group, combinations thereof, and the like. Since the photoresist composition described here is a non-chemically amplified photoresist (Non-CAR) composition, it does not contain a photoacid generator. One or both of the phenyl rings in Chemical Formula 11 or Chemical Formula 12 may be substituted with at least one of C1 to C20 aliphatic group, sulfur (S), nitrogen (N), oxygen (O), halides, and combinations thereof.

As described above, the photoresist composition according to an exemplary embodiment of the present inventive concept is a non-chemically amplified resist (Non-CAR) composition, and more specifically, the photoresist composition includes a protecting group that causes the decarboxylation using the radical. Therefore, the hydrogen ions are not generated, and thus, problems that may occur with the generation of the hydrogen ions may be solved. Therefore, when performing the patterning using the photoresist composition according to an exemplary embodiment of the present inventive concept, it is possible to secure the local CD uniformity (LCDU) of the photoresist pattern and to reduce the line edge rughness (LER) and the line width rughness (LWR).

A method of manufacturing the semiconductor device according to an exemplary embodiment of the present inventive concept will be described referring to FIGS. 1 through 12. The method of manufacturing the semiconductor device according to the present embodiment may use the aforementioned photoresist composition.

FIG. 1 is a flowchart for explaining a method for manufacturing the semiconductor device according to an exemplary embodiment of the present inventive concept. FIGS. 2 to 10 are cross-sectional views of intermediate steps for explaining the method for manufacturing the semiconductor device according to an exemplary embodiment of the present inventive concept.

Referring to FIG. 1, the method of manufacturing the semiconductor device according to an exemplary embodiment of the present inventive concept includes formation of a mask layer and a photoresist layer on a substrate (S100), formation of a photoresist pattern by patterning the photoresist layer (S110), formation of a mask pattern by patterning the mask layer through the photoresist pattern (S120), and formation of a pattern by etching the substrate through the mask pattern (S130).

Figure 2:
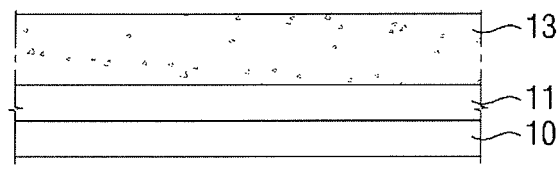
FIGS. 2 to 10 are cross-sectional views of intermediate steps for explaining the method for manufacturing the semiconductor device according to an exemplary embodiment of the present inventive concept.

Referring to FIGS. 1 and 2, a mask layer and a photoresist layer are formed on the substrate (S100).

The substrate 10 may be made of, but not limited to, one or more semiconductor materials selected from a group that includes Si, Ge, SiGe, GaP, GaAs, SiC, SiGeC, InAs and InP. Meanwhile, when the substrate 10 is an etching target layer to be formed with a pattern, the substrate 10 may be called a target layer. The pattern to be formed may be a device pattern for manufacturing the semiconductor device. When the substrate 10 is not an etching target layer to be formed with a pattern, a layer to be etched may be further included on the substrate 10 and the mask layer 11. However, in the present embodiment, although the substrate 10 is described as the layer to be etched, i.e., the target layer, the technical idea of the present inventive concept is not limited thereto.

The mask layer 11 may be formed of, but not limited to, a material including at least one of a silicon oxide film, a silicon nitride film and a silicon oxynitride film. Meanwhile, the mask layer 11 may be formed on the substrate 10, and in this case, the mask layer 11 may be formed of a material having etching selectivity different from the substrate 10.

The photoresist layer 13 may be formed, using, for example, a chemical vapor deposition, spin coating, plasma enhanced CVD (PECVD), high density plasma CVD (HDP-CVD) or the like.

The photoresist layer 13 may be formed on the mask layer 11 to a thickness of 30 to 60 nm. For example, the photoresist layer 13 may be formed, but not limited to, on the mask layer 1 to a thickness of 50 nm. Therefore, the thickness of the photoresist layer 13 may be determined in consideration of the size of the pattern to be formed.

The photoresist layer 13 may be formed using the aforementioned photoresist composition. Therefore, the repeated description will not be provided.

When the photoresist layer 13 is formed by the spin coating process, after dispersing the photoresist on the mask layer 11 in a state of low-speed rotation, through the high-speed rotation after accelerating the rotational speed to a certain rotational speed, the photoresist layer 13 may be adjusted to a desired thickness. After the desired thickness of the photoresist layer 13 is formed, residues may be removed by the low-speed rotation.

Before forming the photoresist layer 13, a chemical treatment may be performed on the surface of the mask layer 11 or the substrate 10 on which the photoresist layer 13 is formed to have good adhesion with the photoresist layer 13. The chemical treatment, for example, may be a hexamethyldisilazane (HMDS) treatment. When the surface of the mask layer 11 or the substrate 10 is hydrophilic, the adhesion of the photoresist layer 13 may be enhanced by converting the surface into being hydrophobic through the chemical treatment.

Figure 3:
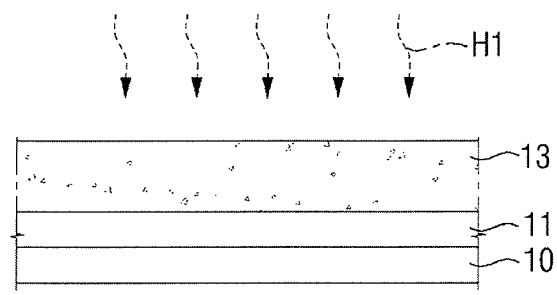
Figure 4:
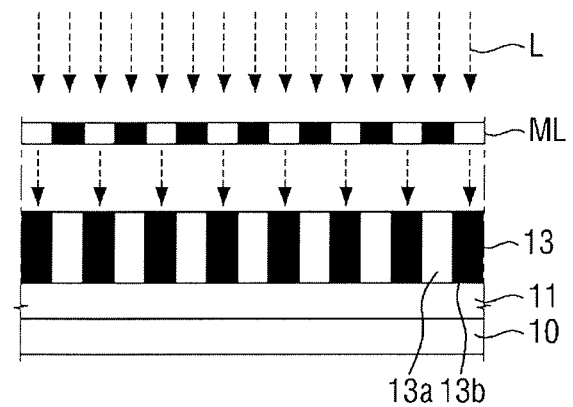

Referring to FIG. 3, a first baking process may be performed.

The first baking process H1 may remove the organic solvent contained in the photoresist layer 13, by applying the heat to the photoresist layer 13 coated on the mask layer 11.

The first baking process H1 may remove the organic solvent contained in the photoresist layer 13, for example, by being performed at about 50 to 250° C. for about 30 to 180 seconds. By increasing the density of the photoresist layer 13 in the first baking process H1, it is possible to reduce the sensitivity in response to changes in the environment, and it is possible to prevent the contamination of the exposure apparatus and the mask caused by the residual organic solvent and to keep the constant photosensitive reaction characteristics of the photoresist layer 13.

Referring to FIGS. 1 and 4 through 7, a photoresist pattern is formed by patterning the photoresist layer (S110).

After a photomask ML for forming the pattern is disposed on the photoresist layer 13, first and second patterns 13a and 13b may be formed by performing an exposure process for irradiating light L.

The first pattern 13a may be a region to which the light L is not irradiated, and the second pattern 13b may be a region to which the light L is irradiated. When the photoresist layer 13 is a positive photoresist, the region to which the light L is irradiated causes a chemical reaction and can be removed by a developer.

In the present embodiment, as described above, the photoresist composition that forms the photoresist layer 13 according to the present inventive concept may be patterned through a photochemical reaction (radical reaction). Thus, although the photoresist layer 13 is described by assuming the case of the positive photoresist, the technical idea of the present inventive concept is not limited thereto.

In the present embodiment, the exposure process of the present step may be an extreme ultraviolet (EUV) exposure process for forming a fine pattern, and it is possible to use, but not limited to, kripton fluoride (KrF) excimer laser (wavelength=248 nm), argon fluoride (ArF) excimer laser (wavelength=193 nm), fluorine excimer laser ($F_2$, wavelength=157 nm), an I-line laser and the like, as a light source.

Although an exposure process using the photomask ML has been described in the present embodiment, this is an example for the description of the present inventive concept, and the present inventive concept is not limited thereto. Therefore, the exposure process according to the present embodiment may be a maskless exposure process that does not use a photomask. The maskless exposure process is usually carried out with particle beams, such as electron beams or ion beams. It may also be carried out with i-line or DUV laser light through an optical-raster-scanning system.

Figure 5:
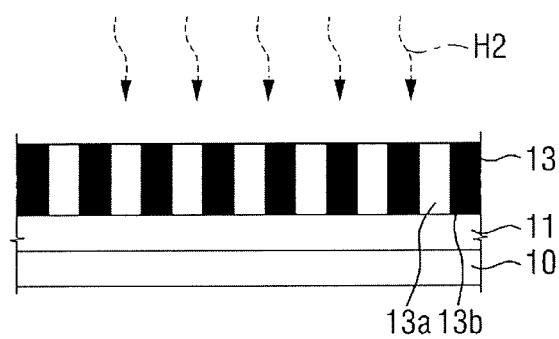

Referring to FIG. 5, a second baking process may be performed.

The photoresist layer 13 may be dried using the second baking process H2. The second baking process H2 mat be performed, but not limited to, at about 50 to 250° C. for about 50 to 250 seconds.

Figure 6:
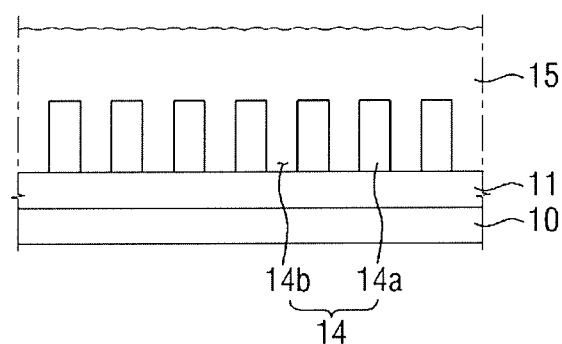
Figure 7:
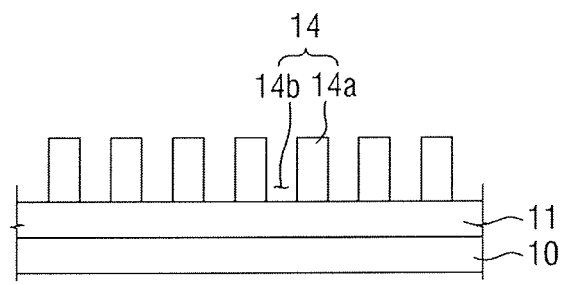

Referring to FIG. 6 again, a photoresist pattern 14 may be formed by applying the developer 15 to the photoresist layer 13. The formed photoresist pattern 14 may include a pattern portion 14a and a recessed portion 14b. As illustrated in FIGS. 6 and 7, the first pattern (13a of FIGS. 4 and 5) of the photoresist layer 13 becomes the patterned portion 14a and the second pattern 13 b is removed to form the recessed portion 14b.

In the development process of this step, the developer 15 may include an aqueous base solution or an organic solvent, and may be, but not limited to, for example, tetramethyl-ammonium-hydroxide (TMAH) aqueous solution, n-butyl acetate (n-BA) or 2-heptanone. A development time through the developer 15 may be determined in consideration of the thickness of the photoresist layer 11.

Figure 8:
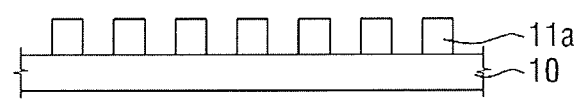

Referring to FIGS. 1 and 8, a mask pattern is formed by patterning the mask layer through the photoresist pattern (S120).

The mask layer 11 may be patterned through a wet etching process or a dry etching process to form a mask pattern 11a. Meanwhile, the developer 15 of FIG. 6 may be removed through a spin process. After removing the developer 15, a cleaning process may be further performed through the cleaning liquid, but the present inventive concept is not limited thereto. When the cleaning process is further performed through the cleaning liquid, the cleaning liquid may be, but not limited to, ultra-pure water (DI water) or organic solvent.

Figure 9:
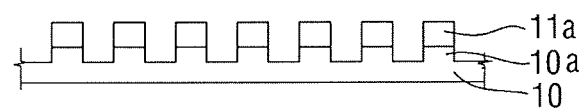
Figure 10:
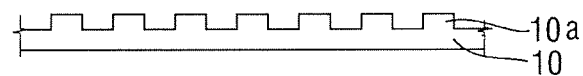

Referring to FIGS. 1, 9 and 10, the substrate is etched through a mask pattern to form a pattern (S130). That is, the pattern 10a may be formed, by etching the substrate 10 using a dry etching or a wet etching through the mask pattern 11a.

As mentioned above, the photoresist composition included in the method of manufacturing the semiconductor device according to an exemplary embodiment of the present inventive concept includes a protecting group that causes the decarboxylation using the radicals. Therefore, hydrogen ions are not generated, and thus, problems that may occur with the generation of hydrogen ions may be solved. Accordingly, the method of manufacturing the semiconductor device according to an exemplary embodiment of the present inventive concept may form a fine pattern with further reduced line edge rughness (LER) and line width rughness (LWR), and eventually may manufacture the semiconductor device with enhanced reliability.

Figure 11:
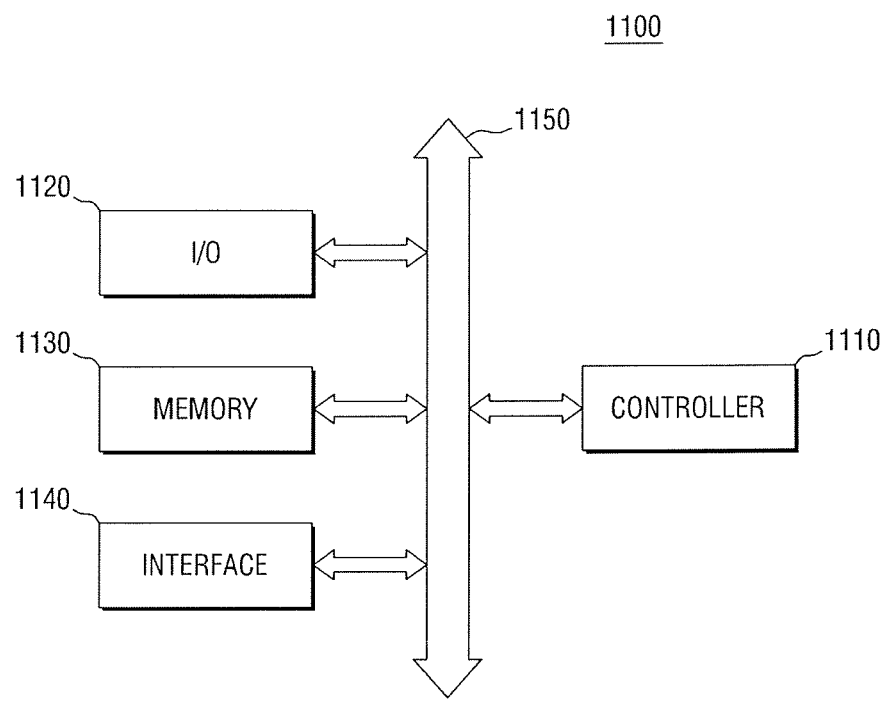
FIG. 11 is a block diagram of an electronic system including the semiconductor device manufactured according to an exemplary embodiment of the present inventive concept.

FIG. 11 is a block diagram of an electronic system including the semiconductor device manufactured according to an exemplary embodiment of the present inventive concept.

Referring to FIG. 11, an electronic system 1100 according to an exemplary embodiment of the present inventive concept may include a controller 1110, an input/output (I/O) device 1120, a memory device 1130, an interface 1140 and a bus 1150. The controller 110, the I/O device 1120, the memory device 1130 and/or the interface 1140 may be coupled to one another through a bus 1150. The bus 1150 corresponds to a path through which the data are moved.

The controller 1110 may include at least one of a microprocessor, a digital signal processor, a microcontroller and logic devices capable of performing functions similar to these devices. The I/O device 1120 may include a keypad, a keyboard, a display device and the like. The memory device 1130 may store data and/or commands. The interface 1140 may serve to transmit data to or receive data from a communication network. The interface 1140 may be a wired or wireless interface. For example, the interface 1140 may include an antenna or a wired or wireless transceiver. Although it is not illustrated, the electronic system 1100 may also include a high-speed DRAM or SRAM, as an operating memory for enhancing the operation of the controller 1110. The semiconductor devices 1 to 11 according to an exemplary embodiment of the present inventive concept may be provided in the memory device 130 or may be provided as a part of the controller 1110, the I/O device 1120 and the like.

The electronic system 1100 may be applied to a personal digital assistant (PDA), a portable computer, a web tablet, a wireless phone, a mobile phone, a digital music player, a memory card or all types of electronic products capable of transmitting or receiving information in a wireless environment.

Figure 12:
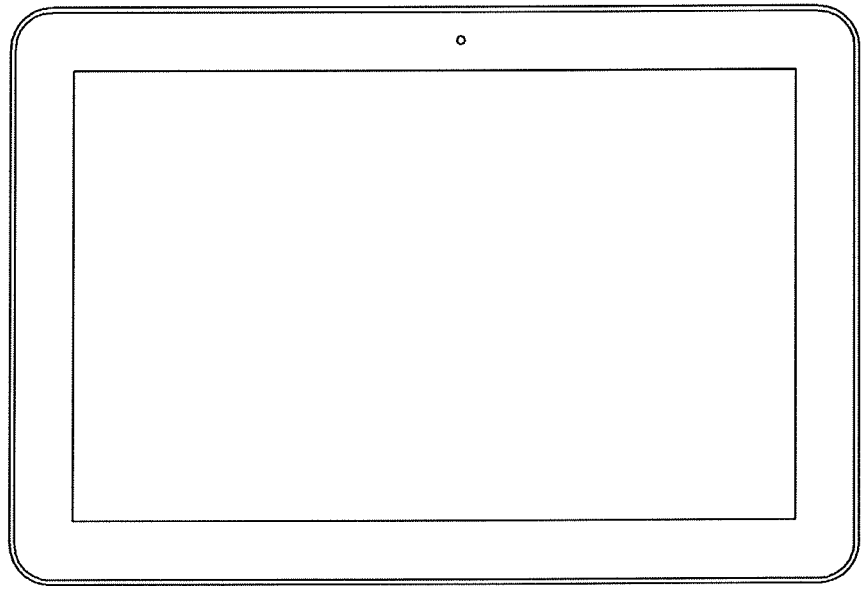
FIG. 12 is a diagram illustrating an example of a semiconductor system to which the semiconductor device manufactured according to an exemplary embodiment of the present inventive concept can be applied.

FIG. 12 is a diagram illustrating an example of a semiconductor system to which the semiconductor device manufactured according to an exemplary embodiment of the present inventive concept can be applied. FIG. 12 illustrates a tablet personal computer. The semiconductor device manufactured according to an exemplary embodiment of the present inventive concept may be used in the tablet PC, the notebook computer and the like. It is obvious to a person skilled in the art that the semiconductor device manufactured according to an exemplary embodiment of the present inventive concept may also be applied to other IC devices other than those set forth herein.

While the present inventive concept has been particularly illustrated and described with reference to the specific exemplary embodiments of the present inventive concept thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A method of manufacturing a semiconductor device, the method comprising:
forming a mask layer and a photoresist layer on a substrate;
forming a photoresist pattern by patterning the photoresist layer;
forming a mask pattern by patterning the mask layer through the photoresist pattern; and
forming a pattern by etching the substrate using the mask pattern,
wherein the formation of the photoresist layer comprises forming the photoresist layer, using a photoresist composition comprising a polymer which is an only component causing photochemical reaction in the photoresist composition and includes a protecting group that causes decarboxylation by radical.

2. The method of claim 1, wherein the polymer is a polymer expressed by at least one of Chemical Formulas 1 through 3 described below:

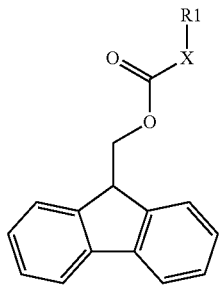

<Chemical Formula 1>

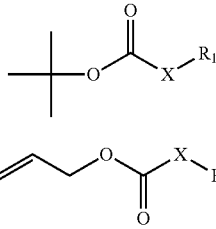

<Chemical Formula 2>

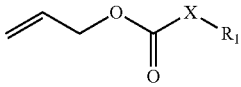

<Chemical Formula 3> wherein R1 comprises an alkyl chain of C1 through C20, and X is O, N or S.

3. The method of claim 1, wherein the formation of the photoresist pattern comprises an exposure process of exposing the photoresist layer, and the radical is a secondary electron generated during the exposure process by a laser light that is incident on the photoresist layer in the exposure process.

4. The method of claim 3, wherein carbon dioxide is generated by the exposure process.

5. The method of claim 3, wherein the laser light uses krypton fluoride (KrF) excimer laser, argon fluoride (ArF) excimer laser, fluorine excimer laser or I-line laser as a light source.

6. The method of claim 3, wherein the polymer comprises at least one of aliphatic carbon chain (C1 to C20), nitrogen (N), oxygen (O) and halides disposed on a phenyl ring.

7. The method of claim 1, wherein the photoresist composition is a non-chemically amplified (Non-CAR) photoresist composition.

8. The method of claim 1, wherein the photoresist composition is a positive photoresist composition.

9. A photoresist composition comprising:
a polymer being an only component causing photochemical reaction in the photoresist composition and including a protecting group that causes a decarboxylation by radical; and
an organic solvent.

10. The photoresist composition of claim 9, wherein the polymer is a polymer expressed by at least one of Chemical Formulas 1 through 3 described below:

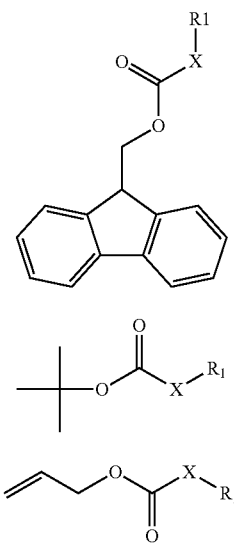

<Chemical Formula 1>

<Chemical Formula 2>

<Chemical Formula 3> wherein R1 comprises an alkyl chain of C1 through C20, and X is O, N or S.

11. The photoresist composition of claim 10, wherein the protecting group is deprotected by the decarboxylation and carbon dioxide is generated.

12. The photoresist composition of claim 10, wherein the polymer comprises a first group that is disposed on a phenyl ring and contains at least one of aliphatic carbon chain (C1 to 20), nitrogen (N), oxygen (O) and halides.

13. The photoresist composition of claim 12, wherein the polymer further comprises a second group that is disposed on a region symmetrical with the first group on the phenyl ring and contains at least one of aliphatic carbon chain (C1 to 20), nitrogen (N), oxygen (O) and halides.

14. The photoresist composition of claim 9, wherein the photoresist composition is a non-chemically amplified (Non-CAR) photoresist composition.

15. The photoresist composition of claim 9, wherein the photoresist composition is a positive photoresist composition.

16. A method of manufacturing a semiconductor device, the method comprising:
providing a substrate having a mask layer on top of the substrate;
depositing a photoresist layer on the mask layer, the photoresist layer comprising a polymer which is an only component causing photochemical reaction in the photoresist layer and includes a repeating unit represented by Chemical Formula A or Chemical Formula B as shown below:

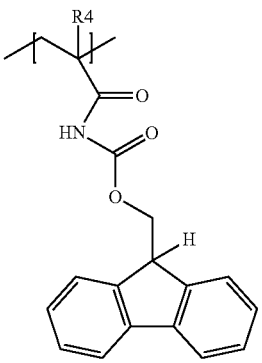

<Chemical Formula A>

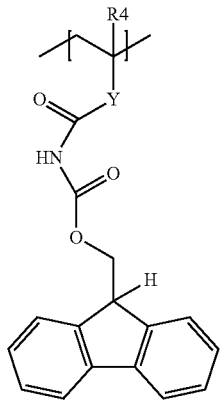

<Chemical Formula B> wherein R4 represents hydrogen, methyl, ethyl, propyl, or trifluoromethyl, and
Y represents a divalent linking group of C1 to C30 aliphatic group, C1 to C30 aromatic group, or any combination thereof, and Y optionally includes N, O, S, halides, or any combination thereof;
patternwise exposing the photoresist layer through a photomask with an EUV light, or an excimer laser light, or without a photomask with a particle beam to form an exposed photoresist layer;
developing the exposed photoresist layer with an aqueous TMAH developer or an alcohol-based solvent to form a photoresist pattern;
etching the mask layer using the photoresist pattern as an etching mask to form a mask pattern; and
etching the substrate using the mask pattern as an etching mask to form a device pattern.

17. The method of claim 16, wherein the polymer further comprises a repeating unit which includes at least one polar group of a hydroxyl group, a carboxylic acid group, a sulfonamide, a dicarboxyimide, a fluoroalcohol, an N-hydroxy dicarboxyimide, an amino group, an imino group, and combinations thereof.

18. The method of claim 16, wherein the photoresist layer does not comprise a photoacid generator.

19. The method of claim 16, wherein the excimer laser light uses krypton fluoride (KrF) excimer laser, argon fluoride (ArF) excimer laser, or fluorine excimer laser as a light source.

20. The method of claim 16, wherein the polymer comprises at least one of C1 to C20 aliphatic group, sulfur (S), nitrogen (N), oxygen (O), halides, and combinations thereof disposed on a phenyl ring.

* * * * *